United States Patent
Ishizaki et al.

(10) Patent No.: US 6,589,447 B1
(45) Date of Patent: Jul. 8, 2003

(54) COMPOUND SEMICONDUCTOR SINGLE CRYSTAL AND FABRICATION PROCESS FOR COMPOUND SEMICONDUCTOR DEVICE

(75) Inventors: Junya Ishizaki, Annaka (JP); Nobuhiko Noto, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 09/719,545

(22) PCT Filed: Apr. 25, 2000

(86) PCT No.: PCT/JP00/02683

§ 371 (c)(1), (2), (4) Date: Dec. 18, 2000

(87) PCT Pub. No.: WO00/65642

PCT Pub. Date: Nov. 2, 2000

(30) Foreign Application Priority Data

Apr. 26, 1999 (JP) ............................................. 11-117700

(51) Int. Cl.$^7$ ................ H01L 31/0304; H01L 31/0296; H01L 21/302; H01L 21/26; C30B 31/20
(52) U.S. Cl. ................ 252/501.1; 252/500; 252/518.1; 252/521.5; 438/735; 438/738; 438/705; 438/715; 438/718; 117/2; 117/3; 117/92; 117/97; 117/904; 117/905; 257/442; 257/635; 257/614; 257/615; 257/189

(58) Field of Search ................................. 438/735, 738, 438/705, 715, 718; 117/904, 905, 2, 3, 92, 97; 257/442, 635, 614, 615, 189; 252/500, 501.1, 518.1, 521.5

(56) References Cited

U.S. PATENT DOCUMENTS 4,555,301 A * 11/1985 Gibson et al. ................. 117/43
5,139,606 A *  8/1992 Maki ........................... 117/106
5,499,599 A *  3/1996 Lowndes et al. ............ 117/105

FOREIGN PATENT DOCUMENTS

JP   59177930   * 10/1984 ......... H01L/21/302
JP   04133327   *  5/1992 ......... H01L/21/306

* cited by examiner

Primary Examiner—Mark Kopec
Assistant Examiner—K M Vijayakumar
(74) Attorney, Agent, or Firm—Arent Fox Kintner Plotkin & Kahn

(57) ABSTRACT

Provided is a compound semiconductor single crystal and a fabrication process for a compound semiconductor device capable of forming a prescribed pattern without requirement of many steps. A group V element component in a III-V compound semiconductor single crystal or a group VI element component in the II-VI compound semiconductor single crystal is reduced less than a composition ratio expressed by a chemical formula of a corresponding compound semiconductor single crystal in a pattern-shaped portion.

10 Claims, 5 Drawing Sheets

COMPOUND SEMICONDUCTOR SINGLE CRYSTAL AND FABRICATION PROCESS FOR COMPOUND SEMICONDUCTOR DEVICE

TECHNICAL FIELD

This invention relates to a compound semiconductor single crystal and a fabrication process for a compound semiconductor device and particularly, to a fabrication process for a compound semiconductor device in which a pattern is efficiently formed on a surface of a compound semiconductor single crystal with no resist coating.

BACKGROUND ART

Many devices such as a photodetector, a light emitting device, a high frequency device and a power device have recently been researched and developed, exploiting various characteristics of compound semiconductors. In fabrication of such compound semiconductor devices, for example, for such as electrode formation and integrated circuit formation, there has generally been adopted a process in which a prescribed pattern is formed on a surface of a compound semiconductor single crystal by a lithographic method to repeat resist coating and exposure.

In this process, however, as shown in conventional steps of FIG. 6, the following steps have been required: resist coating wherein a resist 2 is coated on a surface of a compound semiconductor single crystal 4 on which a silicon oxide film ($SiO_2$) or a silicon nitride film ($SiN_x$) has been deposited, while rotating the single crystal 4 at a high speed (STEP 1, FIG. 6(A)); then pre-bake wherein solvent and water are got out of the resist film 2 (STEP 2); exposure wherein a pattern 6 is printed on the resist film 2 under an ultraviolet light (STEP 3, FIG. 6(B)); development and rinsing wherein the pattern 6 is formed in the resist film 2 (STEP 4, FIG. 6(C)); post-bake wherein a developer and a rinsing liquid is removed from the resist film 2 (STEP 5); and thereafter, etching wherein the oxide film or the nitride film corresponding to the opening pattern 6 is removed by etching (STEP 6).

Thus, since many steps are required for forming a pattern 6 using the lithographic method in which resist coating and light exposure are repeated and a considerable cost is imposed on each step, there is a limitation on cost down as far as this method is employed.

Further, an influence cannot be neglected on damage of the crystal due to the deposition of the oxide film or the nitride film on the crystal surface and thereby the devices may be affected adversely in terms of their operation. In order to solve a problem of the damage, there has been recently proposed and practiced a method to use as a mask material a natural oxide film on a compound semiconductor readily oxidizable, such as AlGaAs. In this method, however, since such a lithographic method as above described is still adopted, a lot of steps are also required and it is difficult to reduce the number of the steps any more.

The present invention has been made in view of the above problems, and therefore an object of this invention is to provide a compound semiconductor single crystal and a fabrication process for a compound semiconductor device capable of forming a prescribed pattern without requirement of resist coating.

DISCLOSURE OF THE INVENTION

In order to solve the above problems, according to the present invention, there is provided a compound semiconductor single crystal, wherein a III-V compound semiconductor single crystal or a II-VI compound semiconductor single crystal includes a region in which a group V element component or a group VI element component is less than a composition ratio expressed by a chemical formula of a corresponding compound semiconductor single crystal.

Further, a fabrication process for a compound semiconductor device of the present invention comprises: a transmuting step of transmuting part of a surface of a III-V compound semiconductor single crystal or a II-VI compound semiconductor single crystal into a pattern-shaped portion by reducing a group V element component in the III-V compound semiconductor single crystal, or a group VI element component in the II-VI compound semiconductor single crystal less than a composition ratio expressed by a chemical formula of a corresponding compound semiconductor single crystal; and an etching step of effecting selective etching on the corresponding compound semiconductor single crystal.

The transmuting step is accomplished by imparting energy on the surface of the compound semiconductor single crystal to heat it. Further, the transmuting step may be accomplished by irradiating a laser beam or an electron beam on the surface of the compound semiconductor single crystal. Still further, in the etching step, the surface of the compound semiconductor single crystal transmuted in the transmuting step is preferably used as a protective film.

Also, a fabrication process for a compound semiconductor device of the present invention comprises: a growth step of forming a III-V compound semiconductor single crystal layer or a II-VI compound semiconductor single crystal layer on a semiconductor single crystal substrate; a transmuting step of irradiating a laser beam on a surface of the compound semiconductor single crystal layer to transmute the surface; and an etching step of effecting selective etching on the compound semiconductor single crystal layer having a region transmuted in the transmuting step to form a protective film.

The laser beam preferably has energy larger than a bandgap of the compound semiconductor single crystal layer to be irradiated with the laser beam. Further, irradiation power of the laser beam is preferably in the range of from 1 $kW/cm^2$ to 5 $kW/cm^2$.

BEST MODE FOR CARRYING OUT THE INVENTION

While description will be given of embodiments of the present invention below, it is needless to say that the descriptions are exemplarily given and should not be construed restrictively.

Figure 1:
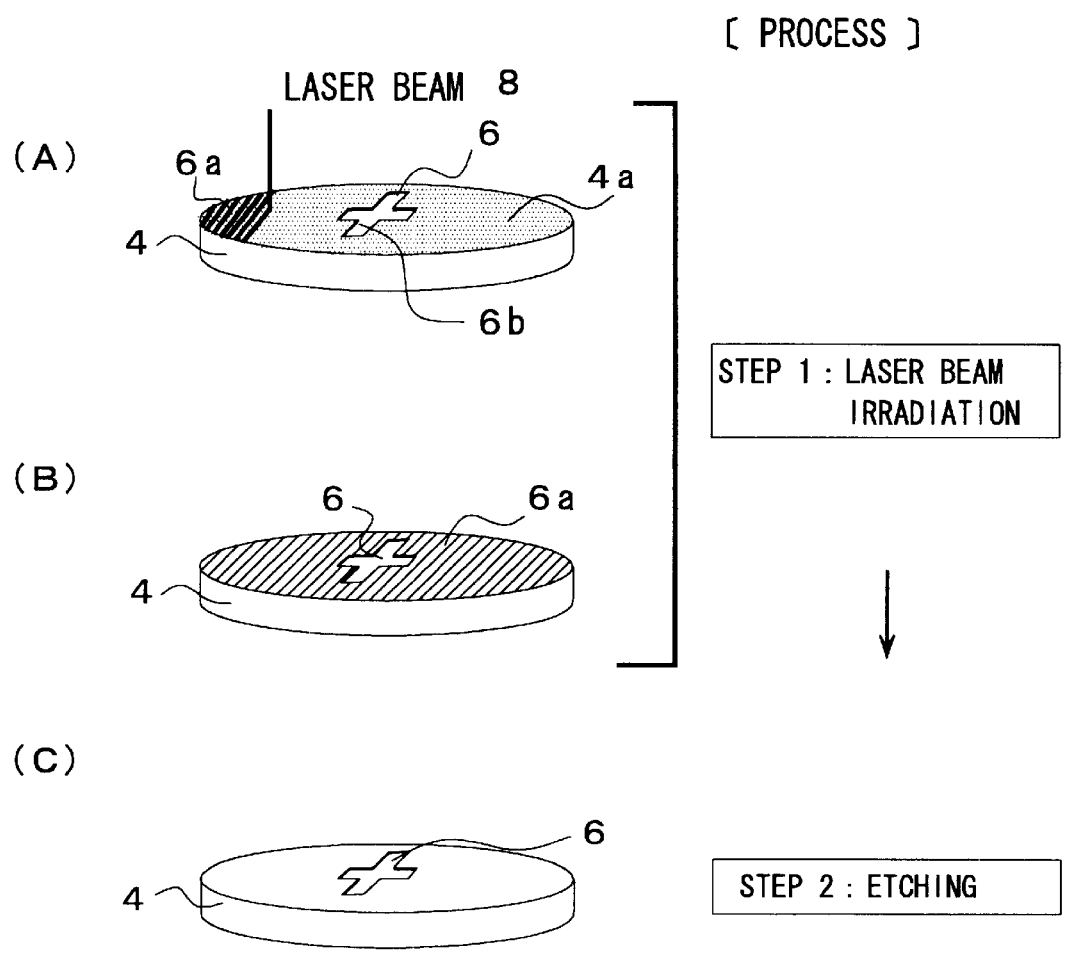
FIG. 1 is a schematic perspective view showing pattern formation steps for a compound semiconductor single crystal of the present invention, wherein (A) and (B) show a laser irradiation step and (C) an etching step.

As shown in schematic perspective views of processing steps of FIG. 1, a surface 4a of a III-V or II-VI compound semiconductor single crystal 4 (hereinafter may be simply referred to as a single crystal 4) is irradiated, for example, with a laser beam (FIG. 1(A) and FIG. 1(B)) and the single crystal 4 is heated through absorption of the applied laser beam energy.

However, when the laser beam energy is equal to the bandgap of the single crystal 4 to be irradiated with the laser beam, photoluminescence arises to consume the energy. Further, when the laser beam energy is smaller than the bandgap of the single crystal 4, the laser beam is transmitted through the crystal 4 without absorption. For this reason, the laser beam energy to be applied to the single crystal 4 is preferably larger than the bandgap of the single crystal 4.

When a III-V or II-VI compound semiconductor single crystal 4 is irradiated with a laser beam, controlling irradiation power thereof properly, part of a group V element or a group VI element with a high vapor pressure is vaporized as gas from the single crystal 4 and therefore in a region irradiated with the laser beam the component of the group V element or the group VI element of the single crystal 4 can be lower than the component of the composition ratio expressed by a chemical formula of the compound thereof.

When the III-V compound semiconductor single crystal 4 is, for example, gallium phosphide, phosphorus with a high vapor pressure is vaporized by applying a laser beam to the gallium phosphide and hence in a region irradiated with the laser beam a composition ratio of phosphorus to gallium becomes lower than 1:1 expressed by the chemical formula GaP.

As a result, the surface 4a of the single crystal 4 is transmuted to a crystal 6a slightly rich in a component of a group III element or a group II element. Since the crystal 6a has a nature akin to group III metals such as Ga, In and Al or group II metals such as Zn and Cd more than the single crystal 4, an etching rate is different from that of the single crystal 4. Generally, the crystal 6a is more akin to a metal in nature, so its etching rate is smaller than that of the single crystal 4.

Then, when the single crystal 4 is chemically etched using a proper etching liquid, etching does not proceed in a region covered and protected with the transmuted crystal 6a akin to a metal in nature, while etching proceeds selectively in a pattern part 6 of the non-transmuted single crystal 4, so that it is enable to form a pattern on the single crystal 4 (FIG. 1(C)).

To transmute the crystal 6a to one akin to a metal in nature is achieved by reducing a component of a group V element or a group VI element by about 5% or more than the composition ration expressed by the chemical formula thereof. The component reduced layer of 0.5 $\mu$m or more, preferably 0.1 $\mu$m or more, can function as a protective film.

Since the transmuted crystal 6a akin to a metal in nature is hard to be etched, it can function as a protective film in etching of a later step.

As a laser applicable for transmuting a surface 4a of the single crystal 4 to the crystal 6a slightly rich in a component of a group III element or a group II element, there may be named a laser capable of vaporizing a group V element or a group VI element, such as an Ar laser, a He—Cd laser and an excimer laser.

A laser actually usable is a laser whose energy is larger than a bandgap of a compound semiconductor single crystal to be irradiated. But He—Cd laser of 325 nm in wavelength is required to be employed for GaN, AlN, AlGaN, InAlN, InGaN and AlGaInN.

An irradiation power of the above described laser is preferably selected to be in the range of from 1 kW/cm$^2$ to 5 kW/cm$^2$ on a surface of a compound semiconductor single crystal to be irradiated. When the irradiation power is larger than 5 kW/cm$^2$, for example, not only a group V element but also a group III element of the III-V compound semiconductor single crystal are vaporized, so that the single crystal is completely destroyed to form a hole. When the irradiation power is smaller than 1 kW/cm$^2$, vaporization of a group V element or a group VI element is not effected sufficiently and therefore, sufficient transmutation of a compound semiconductor single crystal cannot be achieved. It should be here appreciated that a laser can be employed in the air.

The following are a list of III-V compound semiconductors transmutable by irradiation with a laser beam. A common feature shared by the III-V compound semiconductors is that arsenic, phosphorus or nitrogen with a high vapor pressure is included as a group V element component.

GaAs, AlAs, InAs, AlGaAs, AlInAs, InGaAs, GaP, AlP, InP, AlGaP, InGaP, AlInP, AlGaInP, GaAsP, AlAsP, InAsP, AlGaAsP, InGaAsP, AlInAsP, GaN, AlN, InN, AlGaN, AlInN, InGaN, AlGaInN, GaAsN, AlAsN, InAsN, AlGaAsN, InGaAsN and InAlAsN.

Likewise, there are listed below II-VI compound semiconductors transmutable by irradiation with a laser beam.

ZnS, ZnSe, ZnTe, CdS, CdSe and CdTe.

The II-VI compound semiconductors contain sulfur, selenium or tellurium all high in a vapor pressure as a group VI element component and consequently may be transmuted into a crystal slightly rich in a group II element by vaporizing part of a group VI element component with laser beam irradiation.

While the case of laser beam irradiation has been described in the embodiments of the invention, an electron beam may be also used in a similar way by adjusting an irradiation power thereof.

A layer whose composition has been transmuted to be akin to a metal in nature may be again applied to an electrically active use as a compound semiconductor layer by heat treating the transmuted layer in an atmosphere for growing the compound semiconductor layer, and with removal of a layer whose composition is transmuted by dry etching or the like, an underlying non-transmuted layer may be also applied to an electrically active use.

Since a light emitting device in whose current diffusion layer there is formed a current blocking region on whose surface a layer akin to a metal in nature by transmutation of a composition may be fabricated without application of a photolithographic method, the cost thereof is lower. Further, with a laser it is possible to draw a pattern using an inexpensive and simple machine. Further, the present invention may be applied to not only a compound semiconductor layer itself but also an AlGaAs oxide film layer.

The present invention will be described below in greater detail by way of the following examples. It should be understood that the invention is not limited to the examples and various changes and modification may be made without departing from the technical concept of the invention.

EXAMPLE 1

Figure 2:
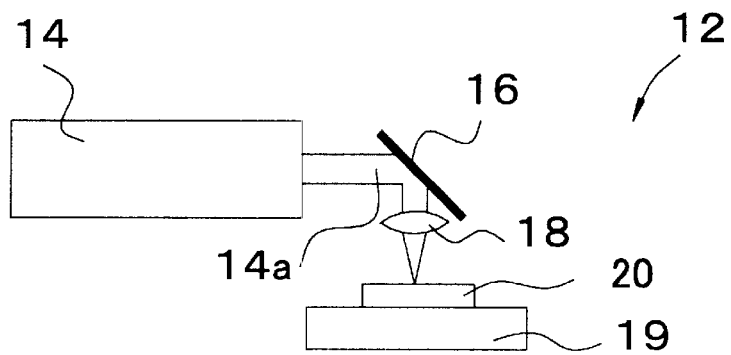
FIG. 2 is an explanatory schematic view of a laser beam irradiation apparatus used in Example 1.

In practice, a laser beam irradiation apparatus 12 shown conceptually in FIG. 2 is used. The laser beam irradiation apparatus 12 includes an Ar laser oscillator 14, a reflecting mirror 16, a collective lens 18, and an X-Y stage 19 operable in horizontal directions.

Figure 3:
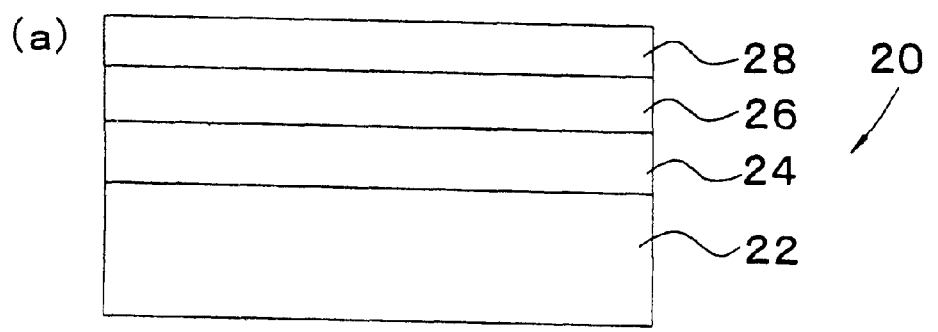
FIG. 3 is a sectional view showing process steps in a pattern formation process in Example 1, wherein (a) shows a compound semiconductor specimen, (b) shows a state of the specimen under irradiation with a laser beam and (c) shows the specimen after etching.
Figure 3:
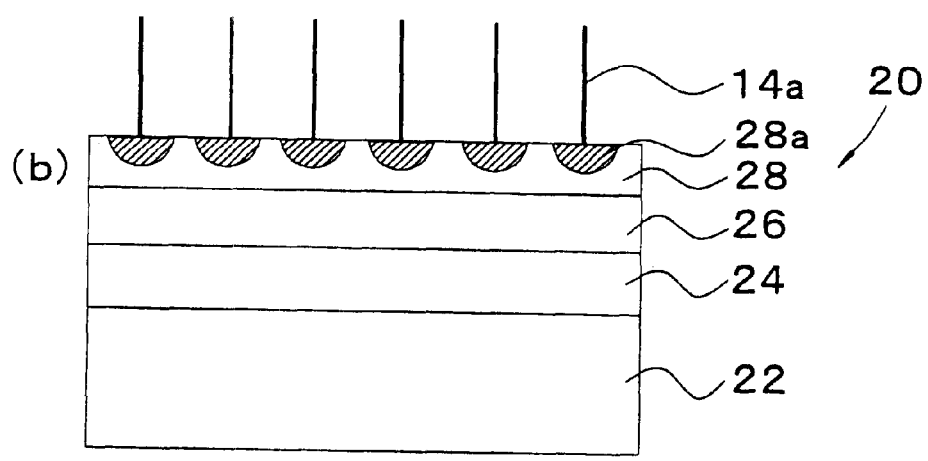
Figure 3:
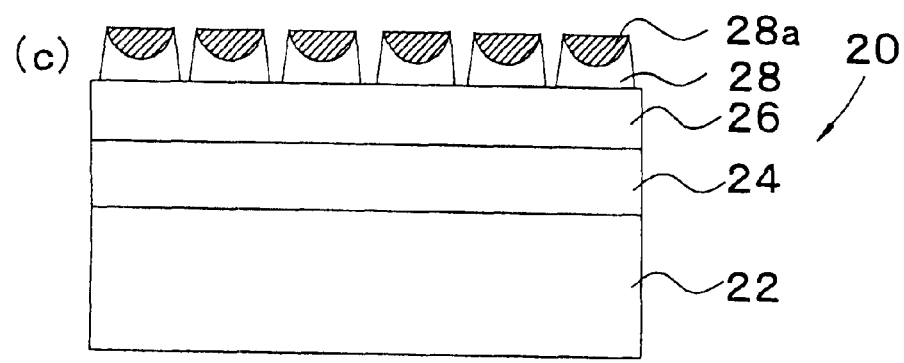

As a specimen 20, as shown in FIG. 3(a), there is used a compound semiconductor single crystal in which a GaAs buffer layer 24, an AlInP layer 26 (a thickness of about 1.0 $\mu$m), and an AlGaAs layer 28 with an AlAs mixed crystal ratio of 0.8 (a thickness of about 5.0 $\mu$m) are stacked in this order on a GaAs single crystal substrate 22. An indirect transition bandgap of the AlGaAs layer 28 is about 2.0 eV for an Al As mixed crystal ratio of 0.8.

After the specimen 20 is placed on the X-Y stage 19, an argon laser beam 14a of energy of 2.4 eV and a wavelength of 514. 5 nm is irradiated for several seconds to each point on a surface of the AlGaAs layer 28, collecting the laser beam by the collective lens 18 and keeping the irradiation power constant (FIG. 3(b)).

Then in a region irradiated with the laser beam, arsenic included in the AlGaAs layer 28 is vaporized, and thereby a region 28a whose As a component is lower than a composition expressed by AlGaAs is formed in the AlGaAs layer 28 of the specimen 20.

Further, a surface composition of the AlGaAs layer 28 irradiated with the laser beam is transmuted to the level of a composition of $(AlGa)_{0.525}As_{0.475}$. Also, for laser irradiation power of 5 kW/cm$^2$, the AlGaAs layer 28 irradiated with the laser beam is presumably transmuted from the surface to a depth of about 3 $\mu$m.

Successively, the irradiated specimen 20 is etched with a mixed etching liquid including sulfuric acid and hydrogen peroxide. Since the AlGaAs layer 28 on the surface of the specimen 20 is irradiated with the laser beam 14a to be transmuted to a more metallic state, when etching the specimen 20 with the mixed etching liquid including sulfuric acid and hydrogen peroxide, while an AlGaAs portion 28a irradiated with the laser beam remains behind, only the AlGaAs portion 28 not irradiated with the laser beam is selectively etched (FIG. 3(c)).

Further, the mixed etching liquid including sulfuric acid and hydrogen peroxide has a higher etching rate to the AlGaAs layer 28 but a lower etching rate to the AlInP 26 and thus can substantially etch the AlGaAs layer 28 only. Accordingly, if the AlInP layer 26 is provided under the AlGaAs layer 28, the etching can be stopped by the AlInP layer 26.

With the above mentioned procedure, a pattern as shown in FIG. 3(c) can be formed with no resist coating, so that it is possible to fabricate a compound semiconductor device without the need of many steps.

EXAMPLE 2

Figure 4:
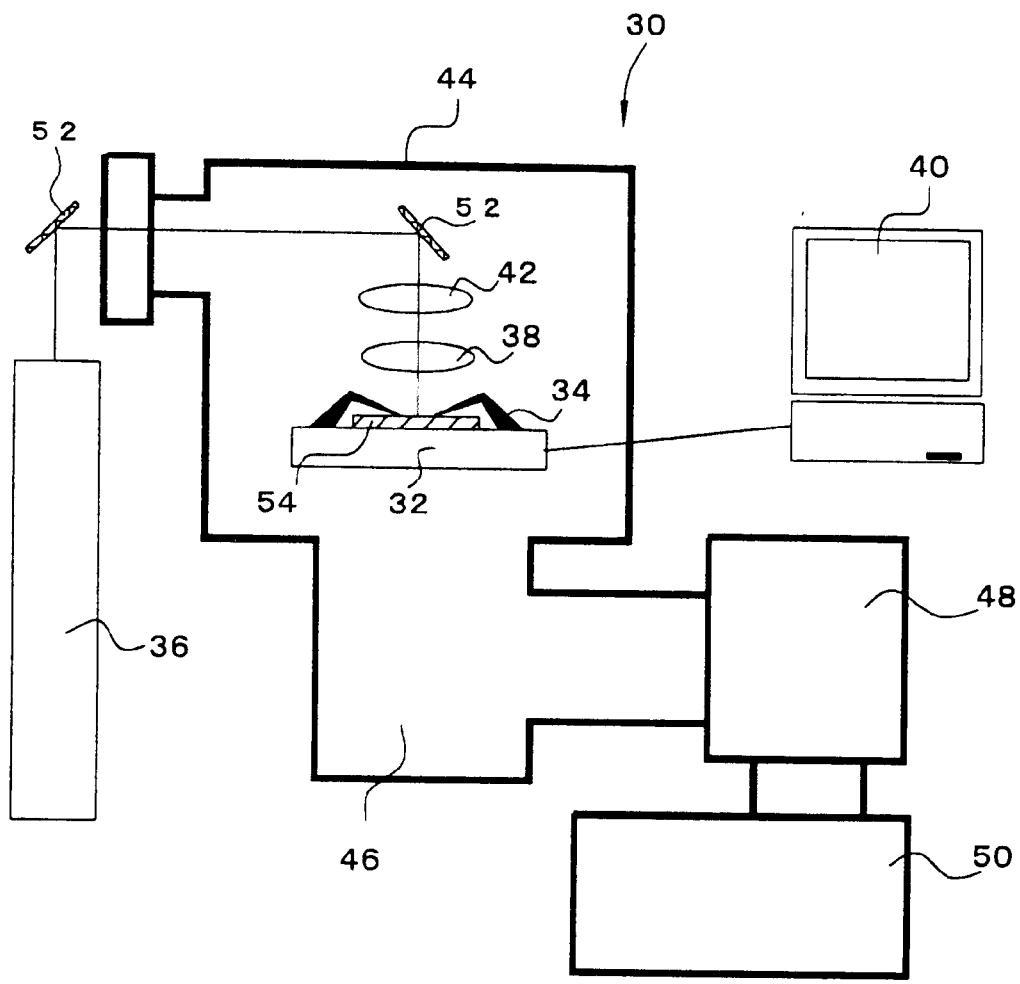
FIG. 4 is a schematic, partial cross-sectional side view of the laser beam irradiation apparatus used in Example 2.

In this example, a laser beam irradiation apparatus 30 shown conceptually in FIG. 4 is used. The laser beam irradiation apparatus 30 includes a finely movable X-Y stage 32, a specimen fixing holder 34, a laser oscillator 36, a collective lens 38, an X-Y stage control computer 40, a laser spot diameter collective lens 42, a vacuum chamber 44, an ion pump 46, a turbo molecular pump 48, a rotary pump 50, and a reflecting mirror 52. A reference numeral 54 denotes a compound semiconductor material placed on the X-Y stage 32.

The X-Y stage 32 has a stage which can move stepwise at intervals of 1 $\mu$m or less. As a laser beam, there is used an argon laser of energy of 2.4 eV and a wavelength of 514.5 nm.

The collective lens 38 with magnifying power of 1 to 100 is used. The X-Y stage control computer 40 is capable of programming a drawing pattern. The collective lens 42 is capable of collecting light beams into 10 $\mu$m to 100 $\mu$m in diameter. When the vacuum chamber 44 is provided, a low laser irradiation power can be practically employed. While the vacuum chamber 44 is installed at need, it is possible not to install it.

Figure 5:
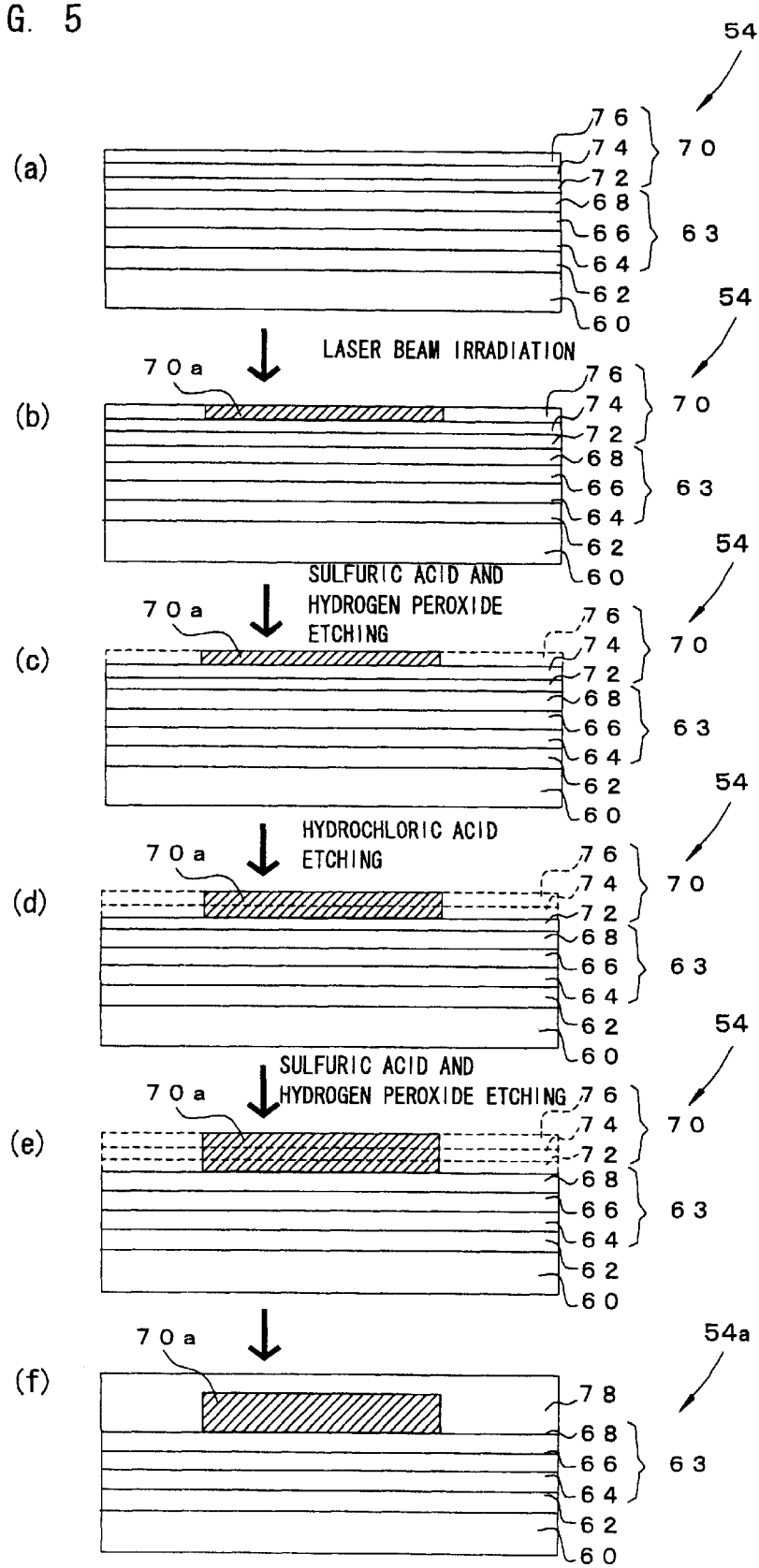
FIG. 5 is a sectional view showing steps in a fabrication process for a compound semiconductor light emitting device in Example 2, wherein (a) shows a compound semiconductor single crystal, (b) shows a state of the single crystal under irradiation with a laser beam, (c) shows a state of the single crystal whose GaAs layer has been etched off, (d) shows a state of the single crystal whose AlInP layer has been etched off, (e) shows a state of the single crystal whose GaAs layer has been etched off and (f) shows a state of the single crystal in which a current diffusion layer has been grown.
Figure 6:
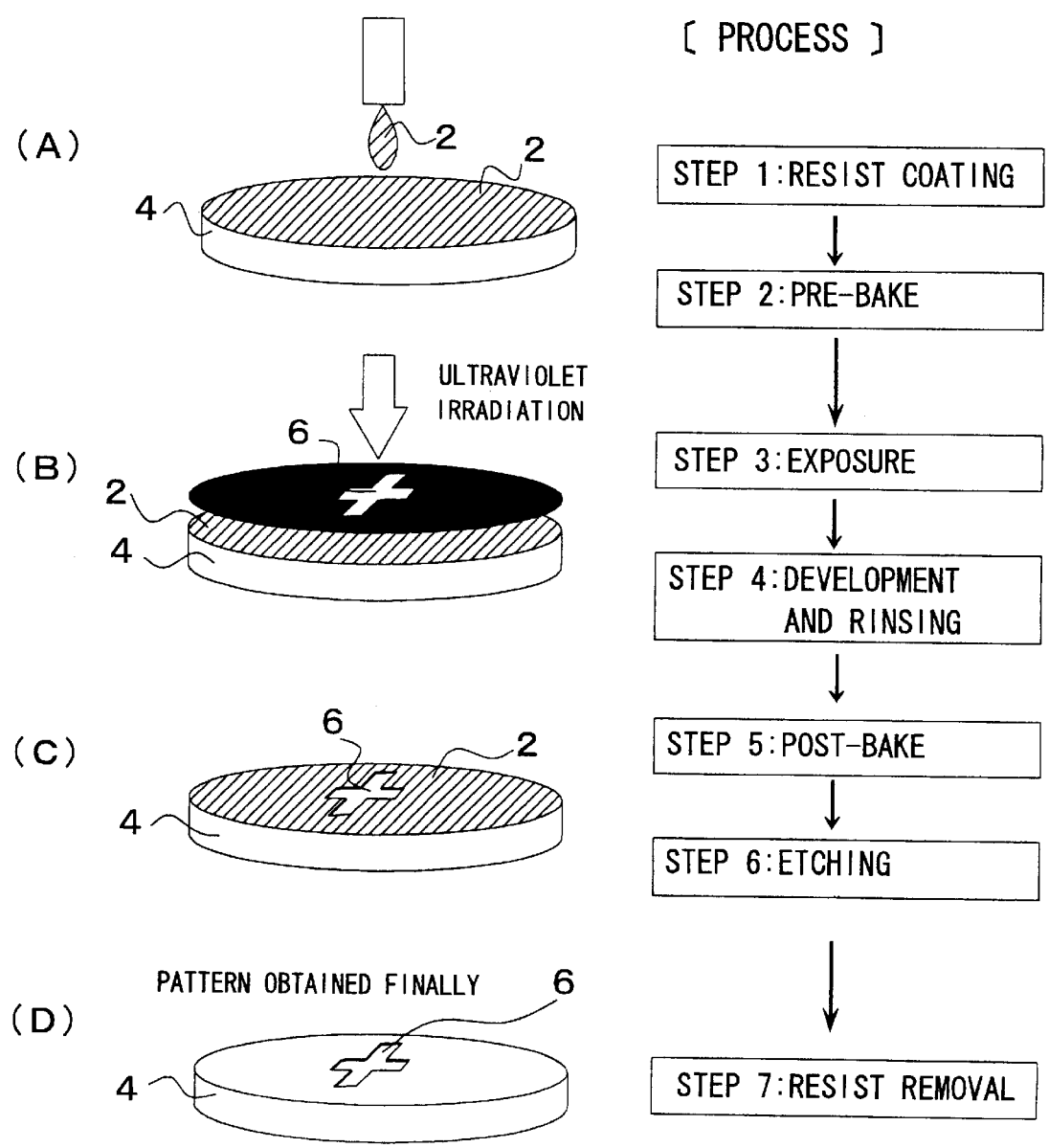
FIG. 6 is a schematic perspective view showing pattern formation steps and a flow of typical steps on a compound semiconductor single crystal according to a conventional practice, wherein (A) shows a state of a compound semiconductor single crystal on whose surface a resist is coated, (B) shows an exposure step in which a pattern is defined under ultraviolet irradiation, (C) shows a pattern after developing and rinse and (D) shows a pattern obtained finally.

In FIG. 5, a compound semiconductor material 54 which is subjected to a series of steps to fabricate a light emitting device is produced as follows. First of all, an n-type GaAs buffer layer 62 is grown to a thickness of 1 $\mu$m on a GaAs substrate 60 with a plane orientation of (001) tilted toward the (111) A plane direction by 5 to 15 degrees. Then, in order to form a double heterostructure layer 63, an n-type AlInP cladding layer 64 of a thickness of 1 $\mu$m, an undoped AlGaInP active layer 66 of a thickness of 0.6 $\mu$m and a p-type AlInP cladding layer 68 of a thickness of 1 $\mu$m are sequentially grown.

Furthermore, in order to form a blocking region 70a, there is grown a blocking layer 70 including an n-type GaAs layer 72 of a thickness of 0.1 $\mu$m, an n-type AlInP layer 74 of a thickness of 1.5 $\mu$m and an n-type GaAs layer 76 of a thickness of 0.1 $\mu$m.

The blocking region 70a is formed in an n-type and has a opposite conductivity type from a p-type current diffusion layer 78 shown in FIG. 5(f), thus blocking partially a current flowing in the current diffusion layer 78 toward the double heterostructure layer 63 in a light emitting region and concentrating the current within a region other than the blocking region 70a to increase the light emission efficiency. If a cross-sectional area through which a current flows in the current diffusion layer 78 is reduced to, for example, ⅕ (one-fifth) by forming the blocking region 70a, a current flowing through a unit cross-sectional area increases fivefold, leading to a five-fold increase in the light emission efficiency.

A pattern formation on the thus prepared compound semiconductor single crystal 54 shown in FIG. 5(a) is performed as follows.

First of all, a laser beam of a spot diameter of 10 $\mu$m is irradiated in the air over a rectangular area on a surface of the n-type GaAs layer 76 with irradiation power of 5 kW/cm$^2$ on the GaAs layer 76 for an average time of 5 sec. Then part of arsenic with a high vapor pressure is vaporized from the n-type GaAs layer 76 of a thickness of 0.1 $\mu$m to form the blocking region 70a transmuted in part of the GaAs layer 76 (FIG. 5(b)).

Subsequently, a mixed etching liquid composed of 97.2 wt % sulfuric acid:0.5 wt % hydrogen peroxide:2.3 wt % pure water is used to selectively etch the GaAs layer 76 at 50° C. for 3 minutes and remove the GaAs layer 76 other than the transmuted blocking region 70a (FIG. 5(c)). The blocking region 70a which remained behind after the selective etching functions as a protective film in the following etching steps.

Next, a mixed etching liquid composed of 30.8 wt % hydrochloric acid:69.2 wt % pure water is used to etch the AlInP 74 at 22° C. for 1 minute for removing the AlInP layer 74 other than part covered by the blocking region 70a (FIG. 5(d)).

Furthermore, a mixed etching liquid composed of 97.2 wt % sulfuric acid:0.5 wt % hydrogen peroxide:2.3 wt % pure water is used to etch the GaAs layer 72 at 50° C. for removing the GaAs layer 72 other than part covered by the blocking region 70a (FIG. 5(e)).

Then, a p-type AlGaAs layer as a current diffusion layer 78 is grown to a thickness of 10 $\mu$m on the n-type blocking region 70a (FIG. 5(f)).

Finally, an n-type electrode is formed on a surface of the GaAs substrate 60, while a p-type electrode is formed on a surface of the current diffusion layer 78, and as a result a compound semiconductor light emitting device having the blocking region 70a in the current diffusion layer 78 can be fabricated.

CAPABILITY OF EXPLOITATION IN INDUSTRY

As described above, while in the prior art, in order to form a pattern a photolithographic method requiring a lot of steps was indispensably used, according to the present invention, a region is formed in a III-V or II-VI compound semiconductor single crystal to be patterned, in which a group V element component or a group VI element component is less than a composition ratio expressed by a chemical formula of a corresponding compound semiconductor single crystal and therefore, a pattern can be formed without requirement of resist coating, with the result that various devices such as a photodetector, a light emitting device, a high frequency device and a power device, which are fabricated using a compound semiconductor single crystal, can be fabricated with a simple process including the greatly reduced number of steps.

What is claimed is:

1. A compound semiconductor single crystal, wherein a III-V compound semiconductor single crystal, an AlGaAs oxide film layer or a II-VI compound semiconductor single crystal includes a region in which a group V element component or a group VI element component is less than a composition ratio expressed by a chemical formula of a corresponding compound semiconductor single crystal, wherein the III-V compound is selected from the group consisting of AlAs, InAs, AlGaAs, AlInAs, AlP, AlGaP, InGaP, AlInP, AlGaInP, GaAsP, AlAsP, InAsP, AlGaAsP, AlInAsP, GaN, AlN, InN, AlGaN, AlInN, InGaN, AlGaInN, GaAsN, AlAsN, InAsN, AlGaAsN, InGaAsN and InAlAsN, and wherein the II-VI compound is selected from the group consisting of ZnS, ZnSe, ZnTe, CdS, CdSe and CdTe.

2. A fabrication process for a compound semiconductor device comprising:

a transmuting step of transmuting part of a surface of a III-V compound semiconductor single crystal, an AlGaAs oxide film layer or a II-VI compound semiconductor single crystal into a pattern-shaped portion by reducing a group V element component in the III-V compound semiconductor single crystal or in the AlGaAs oxide film layer, or a group VI element component in the II-VI compound semiconductor single crystal less than a composition ratio expressed by a chemical formula of a corresponding compound semiconductor single crystal, wherein the III-V compound is selected from the group consisting of AlAs, InAs, AlGaAs, AlInAs, AlP, AlGaP, InGaP, AlInP, AlGaInP, GaAsP, AlAsP, InAsP, AlGaAsP, AlInAsP, GaN, AlN, InN, AlGaN, AlInN, InGaN, AlGaInN, GaAsN, AlAsN, InAsN, AlGaAsN, InGaAsN and InAlAsN, and wherein the II-VI compound is selected from the group consisting of ZnS, ZnSe, ZnTe, CdS, CdSe and CdTe; and an etching step of effecting selective etching on the corresponding compound semiconductor single crystal or the AlGaAs oxide film layer.

3. A fabrication process for a compound semiconductor device according to claim 2, wherein the transmuting step is accomplished by imparting energy on the surface of the compound semiconductor single crystal to heat it.

4. A fabrication process for a compound semiconductor device according to claim 3, wherein the transmuting step is accomplished by irradiating a laser beam on the surface of the compound semiconductor single crystal.

5. A fabrication process for a compound semiconductor device according to claim 2, wherein the etching step, the surface of the compound semiconductor single crystal transmuted in the transmuting step is used as a protective film.

6. A fabrication process for a compound semiconductor device according to claim 3, wherein the etching step, the surface of the compound semiconductor single crystal transmuted in the transmuting step is used as a protective film.

7. A fabrication process for a compound semiconductor device according to claim 4, wherein the etching step, the surface of the compound semiconductor single crystal transmuted in the transmuting step is used as a protective film.

8. A fabrication process for a compound semiconductor device comprising:

a growth step of forming a III-V compound semiconductor single crystal layer, an AlGaAs oxide film layer or a II-VI compound semiconductor single crystal layer on a semiconductor single crystal substrate, wherein the III-V compound is selected from the group consisting of AlAs, InAs, AlGaAs, AlInAs, AlP, AlGaP, InGaP, AlInP, AlGaInP, GaAsP, AlAsP, InAsP, AlGaAsP, AlInAsP, GaN, AlN, InN, AlGaN, AlInN, InGaN, AlGaInN, GaAsN, AlAsN, InAsN, AlGaAsN, InGaAsN and InAlAsN, and wherein the II-VI compound is selected from the group consisting of ZnS, ZnSe, ZnTe, CdS, CdSe and CdTe;

a transmuting step of irradiating a laser beam on a surface of the compound semiconductor single crystal layer or the AlGaAs oxide film layer to transmute the surface; and an etching step of effecting selective etching on the compound semiconductor single crystal layer or the AlGaAs oxide film layer having a region transmuted in the transmuting step to form a protective film.

9. A fabrication process for a compound semiconductor device according to claim 8, wherein the laser beam has energy larger than a bandgap of the compound semiconductor single crystal layer to be irradiated with the laser beam.

10. A fabrication process for a compound semiconductor device according to claim 9, wherein irradiation power of the laser beam is in the range of from 1 kW/cm$^2$ to 5 kW/cm$^2$.

* * * * *